(12) United States Patent
Bhatt et al.

(10) Patent No.: US 6,414,509 B1
(45) Date of Patent: Jul. 2, 2002

(54) METHOD AND APPARATUS FOR IN-SITU TESTING OF INTEGRATED CIRCUIT CHIPS

(75) Inventors: Anilkumar Chinuprasad Bhatt, Johnson City; Leo Raymond Buda, Vestal; Robert Douglas Edwards, Binghamton; Paul Joseph Hart; Anthony Paul Ingraham, both of Endicott; Voya Rista Markovich, Endwell; Jaynal Abedin Molla, Endicott; Richard Gerald Murphy, Binghamton; George John Saxenmeyer, Jr., Apalachin; George Frederick Walker, New York; Bette Jaye Whalen, Vestal; Richard Stuart Zarr, Apalachin, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/564,652

(22) Filed: May 3, 2000

Related U.S. Application Data

(62) Division of application No. 08/352,301, filed on Dec. 8, 1994, now abandoned, which is a continuation of application No. 08/024,549, filed on Mar. 1, 1993, now abandoned.

(51) Int. Cl.⁷ .......................... G01R 31/02; G01R 31/26
(52) U.S. Cl. .................. 324/765; 324/760; 324/754
(58) Field of Search .................... 324/760, 765, 324/754

(56) References Cited

U.S. PATENT DOCUMENTS

| 4,189,825 A | 2/1980 | Robillard et al. .............. 29/574 |
| 4,328,286 A | 5/1982 | Crosby ........................ 428/636 |
| 4,716,124 A | 12/1987 | Yerman et al. ................. 437/8 |
| 4,820,976 A | 4/1989 | Brown ........................ 324/760 |
| 5,118,299 A | * 6/1992 | Beaumont et al. ............. 439/74 |
| 5,137,461 A | * 8/1992 | Bindra et al. ................ 439/74 |
| 5,237,269 A | * 8/1993 | Aimi et al. ............... 324/158.1 |
| 5,420,520 A | * 5/1995 | Anschel et al. .............. 324/754 |
| 5,523,696 A | * 6/1996 | Charlton et al. ............. 324/754 |
| 5,574,386 A | * 11/1996 | Beaumont et al. ........... 324/765 |
| 5,672,980 A | * 9/1997 | Charlton et al. ............. 324/754 |
| 6,037,786 A | * 3/2000 | Palagona ..................... 324/754 |
| 6,188,231 B1 | * 2/2001 | Palagona ..................... 324/754 |

FOREIGN PATENT DOCUMENTS

| EP | 20020 | 12/1980 |
| EP | 54695 | 6/1982 |

OTHER PUBLICATIONS

"High Performance Test System", IBM Technical Disclosure Bulletin, vol. 33, No. 1A (Jun. 1990), pp. 124–125.
"Dendrite Conduction Module", IBM Technical Disclosure Bulletin, vol. 20, No. 6 (Nov. 1977), p. 2218.

* cited by examiner

Primary Examiner—Michael J. Sherry
Assistant Examiner—Jermele Hollington
(74) Attorney, Agent, or Firm—Lawrence R. Fraley; Richard M. Goldman

(57) ABSTRACT

A method of testing semiconductor chips is disclosed. The individual semiconductor chips have I/O, power, and ground contacts. In the method of the invention a chip carrier is provided. The chip carrier has contacts corresponding to the contacts on the semiconductor chip. The carrier contacts have dendritic surfaces. The chip contacts are brought into conductive contact with the conductor pads on the chip carrier. Test signal input vectors are applied to the inputs of the semiconductor chip, and output signal vectors are recovered from the semiconductor chip. After testing, the chip may be removed from the substrate. Alternatively, the chip may be bonded through the dendritic conductor pads to the substrate after successful testing.

5 Claims, 2 Drawing Sheets

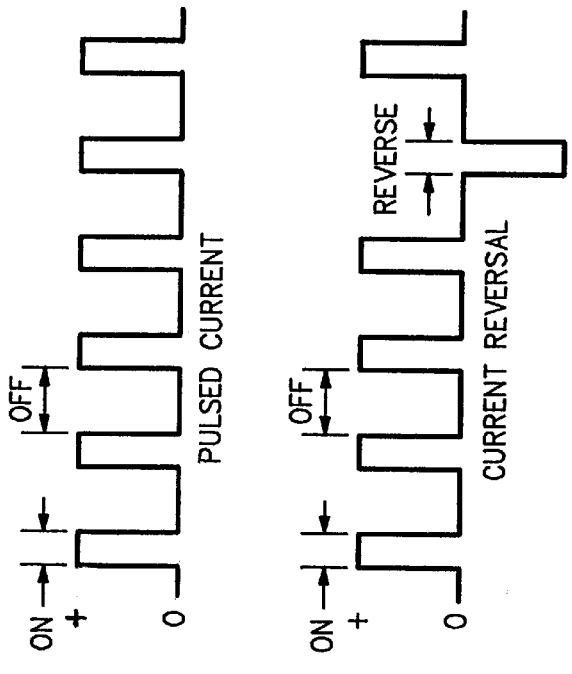
FIG.3
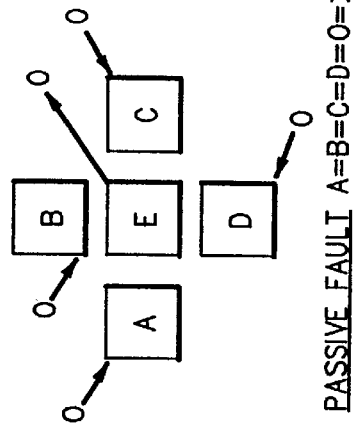
FIG.4
PASSIVE FAULT A=B=C=D=0 => E=0
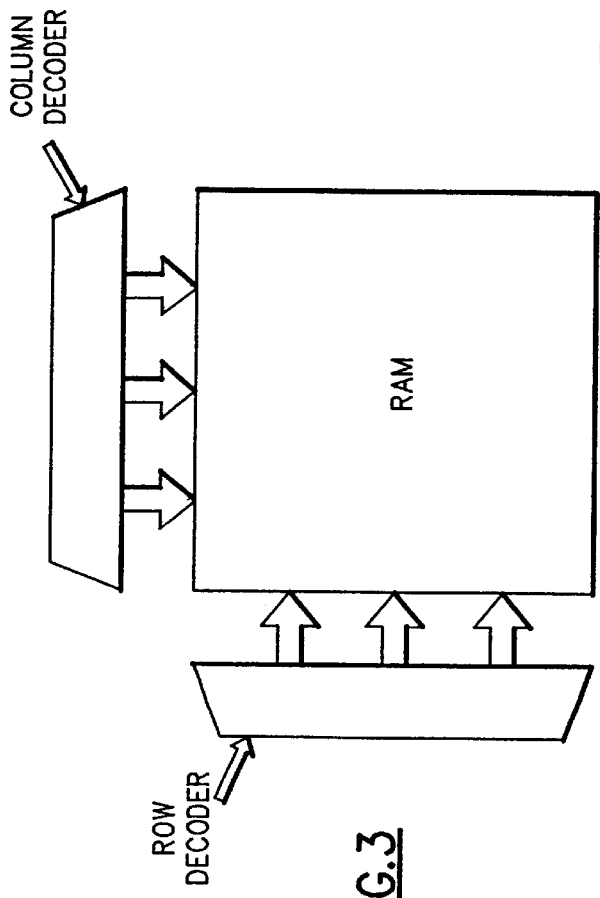
FIG.5
ACTIVE FAULT D↕ => E↕
FIG.6A Prior Art
PULSED CURRENT
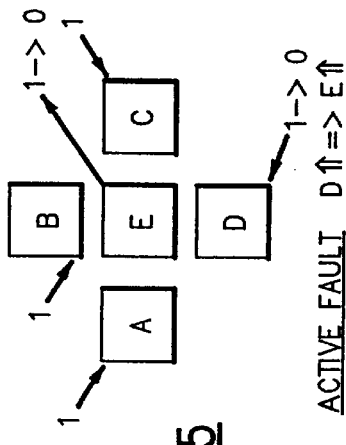
FIG.6B
CURRENT REVERSAL

METHOD AND APPARATUS FOR IN-SITU TESTING OF INTEGRATED CIRCUIT CHIPS

REFERENCE TO APPLICATIONS

This application is a divisional application of Ser. No. 08/352,301 filed Dec. 8, 1994, now abandoned, which is a continuation application of Ser. No. 08/024,549, filed Mar. 1, 1993 and now abandoned.

FIELD OF THE INVENTION

The invention relates to integrated circuit chip testing. Typically, integrated circuit chips are attached to a chip carrier, thermally conductive module chip carrier, circuit card or board, e.g., by solder bonding, controlled collapse chip connect, or the like. For the first time since the wafer was diced, the chip is tested, e.g., electrically tested and logically tested. Some of the tests are subtle, for example tests for active and passive pattern faults and "stuck at 1" or "stuck at 0" faults. When a fault is found, the chip is removed from the card or board. This is not a simple "desoldering" step, especially in the case of high I/O density integrated circuit chips, bonded with encapsulation chip connect technologies, and usually present in multi-chip modules. When a chip is found to be defective, it must be removed, the chip site redressed, and a new chip installed for testing. In the case of a polymeric substrate, redressing the chip site might include milling.

According to the method of the invention, there is provided a method of testing semi-conductor chips. The individual semiconductor chips have I/O, power, and ground contacts. In the method of the invention a chip carrier is provided. The chip carrier may be the substrate, or a dedicated fixture just for testing chips. This chip carrier has contacts corresponding to the contacts on the semiconductor chip. The carrier contacts are low contact resistance contacts adapted for holding the integrated circuit chip in place during testing, with low impedance, while allowing easy removal of defective chips and their replacement by other chips.

According to the invention the test fixture contacts have dendritic surfaces. By dendrites are meant essentially vertical members extending outwardly from a generally planar area of conductive material. The dendrites, produced by a columnar growth process, generally have an aspect ratio, of vertical to horizontal dimensions, of at least about 1.0, a height above the planar area of conductive material of about 10 to 100 micrometers.

The chip contacts are brought into conductive contact with the dendrite bearing conductor pads on the chip carrier. Conductive contact requires a low impedance, low contact resistance contact, with the integrated circuit chips being secured from lateral movement with respect to the substrate or fixture. Test signal input vectors are applied to the inputs of the semiconductor chip, and output signal vectors are recovered from the semiconductor chip.

In the case where the substrate is a temporary test fixture, the chips may be removed from the fixture and either discarded or attached to a suitable substrate. Alternatively, when the chips have been tested in situ, the tested and qualified chips may be bonded through the dendritic conductor pads to the substrate, and the chips which have failed may be removed and discarded without causing need for repair or redressing of the chip site prior to placement of another chip.

BACKGROUND OF THE INVENTION

In the population of integrated circuit chip carriers, including thermally conductive modules, ceramic substrates, and polymeric substrates, it is necessary to minimize the shipment of modules with defective integrated circuit chips, while minimizing the cost of testing and replacement.

Integrated circuit are subjected to various wafer level tests during various stages of fabrication prior to dicing. However, after dicing it is particularly difficult and expensive to test integrated circuit chips. One reason is that an integrated circuit chip must be tested through its I/O and pads before populating of the carrier, card, board, or the like.

In populating a card, board or other packages integrated circuit chips are attached to a circuit card or board, e.g., by solder bonding, controlled collapse chip connect, wire lead bonding, or the like. The chip is then tested as part of an assembly, e.g., electrically tested and logically tested. Some of the tests are subtle, for example tests for active and passive pattern faults and "stuck at 1" or "stuck at 0" faults. When a fault is found, the chip is removed from the card or board. This is not a simple "desoldering" step, especially in the case of high I/O density chips, encapsulation chip connect technologies, and multi-chip modules, where the chip must be removed, the chip site redressed, and a new chip installed for testing. In the case of a polymeric substrate, redressing the chip site might include milling.

Dendritic Chip Testers

"High Performance Test System", *IBM Technical Disclosure Bulletin,* Volume 33, No. 1A (June 1990), pp 124–125 describes a test system for ULSI integrated circuit memory and logic chips. In the described method, a first silicon wafer "test board" has metallization complementary to the metallization of the second silicon wafer to be tested. The second silicon wafer has C4 (controlled collapse chip connection) PbSn solder balls on the contacts. The first and second silicon wafers have substantially flat and substantially parallel surfaces, and are said to require a minimum of compressive force for testing.

Anonymous, "New Products Test Interposer" *Research Disclosure,* January 1990, Number 309 (Kenneth Mason Publications Ltd., England) describes a method for fabricating an interposer-type test head to perform electrical testing of printed circuit cards and boards prior to component assembly. The test interposer is built as a mirror image circuit of the circuit to be tested. However, only the points to be tested, as lands and pads, are present. Circuit lines are not present. The test interposer pads are coated with a dendritic material to make electrical contact to the corresponding points on the printed circuit component to be tested. The circuit board or card and the tester are then brought into contact for testing.

Testers

Compressive type testers are described generally in U.S. Pat. No. 4,716,124 to Yerman et al. for TAPE AUTOMATED MANUFACTURE OF POWER SEMICONDUCTOR DEVICES, U.S. Pat. No. 4,820,976 to Brown for TEST FIXTURE CAPABLE OF ELECTRICALLY TESTING AN INTEGRATED CIRCUIT DIE HAVING A PLANAR ARRAY OF CONTACTS, and U.S. Pat. No. 4,189,825 to Robillard et al. for INTEGRATED TEST AND ASSEMBLY DEVICE.

U.S. Pat. No. 4,189,825 to Robillard et al. for INTEGRATED TEST AND ASSEMBLY DEVICE describes a chip of the beam lead type with sharp points on the substrate leads and etched, conical holes in the semiconductor. The semiconductor and conical holes are metallized with a thin, conformal metal film, leaving conical openings in the metallization. These apertures correspond to the sharp points on the substrate leads. According to Robillard et al, the chips may be assembled and tested, with faulty chips removed and replaced before bonding. Bonding is by ultrasonic welding.

Dendritic Connections

Dendritic connections are described in commonly assigned U.S. Pat. No. 5,137,461 of Bindra et al for SEPARABLE ELECTRICAL CONNECTION TECHNOLOGY. Bindra et al describe separable and reconnectable electrical connections for electrical equipment. Bindra et al's connectors have dendrites characterized by an elongated, cylindrical morphology. These cylindrical dendrites are prepared by a high frequency, high voltage, high current density, pulse plating methodology utilizing a low metal ion concentration electrolyte. Bindra et al describe the pulsed electrodeposition of Pd from a 10–150 millimolar Pd tetramine chloride, 5 molar ammonium chloride solution at 50 to 450 hertz and 200 to 1100 milliamperes per square centimeter in a pulse plating technique.

Electrodeposition of Pd dendrites is further described in European Patent 0054695 and U.S. Pat. No. 4,328,286 (European Patent 0020020)

U.S. Pat. No. 4,328,286 (European Patent 20020) to Crosby for ELECTROPLATING A SUBSTRATE WITH TWO LAYERS OF PALLADIUM describes producing a low porosity Pd coating for electrical contacts. The Pd coating is prepared by electrodepositing a first layer of Pd from an aqueous bath containing the cationic complex Pd $(NH_3)_4^{++}$ and free ammonia with supporting anions ($Cl^-$, $Br^-$, $NH_2SO_3^-$, $NO_2^-$ and $NO_3^-$) and then electrodepositing a second Pd layer from an aqueous bath containing the anionic complex $Pd(NO_2)_2^{4-}$ with supporting cations.

Commonly assigned European Patent 54695 (published Jun. 30, 1982, granted Sep. 11, 1985, U.S. application Ser. No. 219,660 filed Dec. 24, 1980) discloses a method of preparing a Pd electrical contact by electrodeposition from a relatively dilute solution that is sprayed onto a cathode which is located completely outside and above the surface of the solution, which is located in a tank. The solution forms a continuous curtain falling from the bottom end of the cathode back into the tank. A higher electric current than usual is used in the deposition process. The dendrites obtained have a larger cross-section than those obtained in conventional processes.

Summary

The art has failed to provide a means for actual or simulated in situ testing of integrated circuit chips, especially "flip chips", allowing bonding if the chips are satisfactory and replacement of the chips are unsatisfactory.

OBJECTS OF THE INVENTION

It is an object of the invention to provide for simulated and actual in situ testing of integrated circuit chips.

It is a further object of the invention to provide a method and apparatus for in situ testing of integrated circuit chips that allows for easy permanent chip attachment of satisfactory chips and easy removal if unsatisfactory chips.

SUMMARY OF THE INVENTION

According to the method of the invention, there is provided a method of testing semiconductor chips. The integrated circuit chips are tested under either simulated or actual in situ conditions. In a preferred exemplification the method and apparatus of the invention allows for easy permanent chip attachment of satisfactory chips and easy removal of unsatisfactory chips.

In the method of the invention a chip carrier is provided. The chip carrier may be the substrate or a fixture just for testing chips. This chip carrier has contacts corresponding to the contacts on the semiconductor chip. The carrier contacts have dendritic surfaces.

The chip contacts are brought into conductive contact with the conductor pads on the chip carrier. Test signal input vectors are applied to the inputs of the semiconductor chip and output signal vectors are recovered from the semiconductor chip.

After testing the chip may be removed from the substrate. Alternatively, the chip may be bonded through the dendritic conductor pads to the substrate after successful testing.

As used herein, "dendrites" are high surface area conductive pads and contacts formed of essentially vertical members extending outwardly from a generally planar area of conductive material. The dendrites, produced by a columnar growth process, generally have an aspect ratio of vertical to horizontal dimensions of at least about 1.0 and a height above the planar area of conductive material of about 10 to 100 micrometers.

The dendritic morphology is obtained by electroplating the underlayer under conditions that give rise to columnar growth; that is, very low metal cation concentration in the electrolyte, with electroplating being carried out at a high voltage, high current, and a high current density. Preferably, the electroplating current is a pulsed current.

The resulting dendrites have a peak height of about 10 to 100 microns and a density (dendrites per unit area) of about 200 to 500 dendrites per square millimeter.

Dendrites have a chip connect pad to dendritic pad contact resistance of about 3 to 5 milliohms.

THE FIGURES

The invention may be understood by reference to the FIGURES.

FIG. 3 is a circuit diagram of a RAM and decoder used to illustrate test vectors.

FIG. 4 is a representation of passive faults in a Random access Memory (RAM) cell.

FIG. 5 is a representation of active faults in a Random Access Memory (RAM) cell.

FIGS. 6A and 6B show the voltage versus time plots for pulsed electroplating. FIG. 6A is a representation of the voltage versus time for the "on/off" electroplating method of the prior art. FIG. 6B is a representation of the voltage versus time plot for the reversal method of a preferred embodiment of the invention herein.

DETAILED DESCRIPTION OF THE INVENTION

According to the method of the invention, there is provided a method of testing and, in a preferred embodiment of the invention, installing, semi-conductor chips. The individual semiconductor chips have I/O, power, and ground contacts. In the method of the invention a chip carrier is provided. The chip carrier may be the substrate or a fixture just for testing chips. This chip carrier has contacts corresponding to the contacts on the semiconductor chip. The carrier contacts have conductive surfaces with provision for enhanced electrical contact, such as columnar dendritic surfaces or polymer core conical connector surfaces, to yield certain and reliable electrical contact over the entire array of carrier contacts.

The chip contacts are brought into conductive contact with the is conductor pads on the chip carrier. Test signal input vectors are applied to the inputs of the semiconductor chip and output signal vectors are recovered from the semiconductor chip.

After testing the chip may be removed from the substrate. Alternatively, the chip may be bonded through the dendritic conductor pads to the substrate after successful testing.

Dendrites

Figure 1:
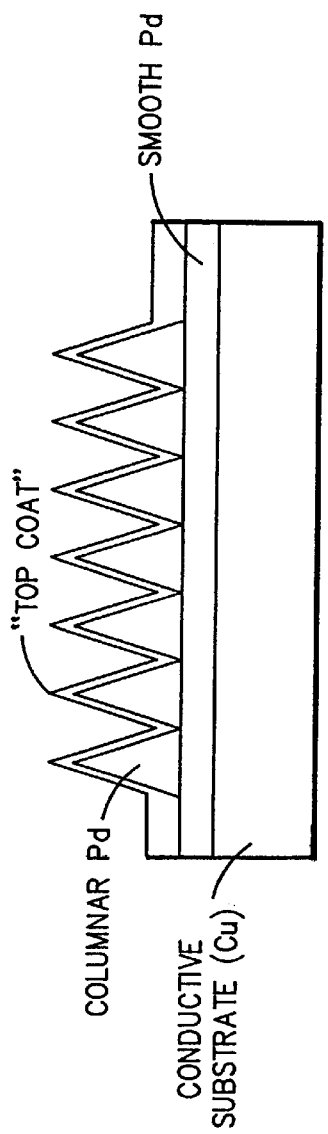
FIG. 1 is a representation of dendritic connectors, shown in cutaway view.

Dendrites are high surface area connectors. They can be used as "pad on pad" connectors, and for chip burn in. Dendrites have the structure shown in FIG. 1, with (a) a conductive pad or substrate, such as a Cu pad, (b) a "smooth" underlayer, as a smooth Pd underlayer, and (c) an overlayer, as a columnar Pd layer. The substrate underlying the conductive pad can be a printed circuit board, a metallized ceramic, or a metal pad on a flexible circuit. The underlayer can be a Pd thin film, e.g., a Pd layer direct current plated from a relatively concentrated electroplated bath. The outer layer is a columnar Pd layer, typically deposited from an electroplating solution that is dilute in metal cation concentration, with a pulsed, high voltage, high current, high current density electroplating solution. There may, optionally, be a gold layer, or a solder layer, as a Bi—Sn or Pb—Sn layer, atop the Pd layer for bonding.

The dendritic morphology is obtained by electroplating the underlayer under conditions that give rise to columnar growth, that is, very low metal cation concentration in the electrolyte, with electroplating being carried out at a high voltage, a high current, and a high current density. Preferably the electroplating current is a pulsed current. In the case of a particularly preferred embodiment of the invention the plating current is pulsed positive and negative.

The dendritic surface is prepared by first electroplating a smooth Pd coating, referred to in the electroplating as a shiny or reflective plate, onto Cu pads. This smooth Pd layer is deposited from a relatively concentrated Pd electroplating solution, containing about 100 or more millimoles of Pd or more, at a low current density of about 5 to 20 milliamperes per square centimeter or lower.

A columnar Pd layer is applied atop the Pd undercoat. This columnar, coat is applied from a relatively dilute Pd electroplating solution having a Pd concentration of about 10–50 millimoles per liter in Pd (versus about 100 millimoles of Pd per liter for conventional electroplating). Typical electroplating solutions include palladium tetra-amine chloride/ammonium chloride, at a pH of about 9 to 10. Typical pulsed electroplating programs include a ten to twenty percent duty cycle, and a current density of about 500 to 1000 mA/cm$^2$.

While satisfactory results are obtained with a single phase pulsed current, as shown in FIG. 6A, and denominated "Prior Art," we have found that superior results are obtained with about 2.5 percent to about 25% voltage reversal with a two phase electroplating cycle, as shown in FIG. 6B. By "single phase" pulsed electroplating cycle, we mean an electroplating current that is pulsed to zero and positive values. By a "two phase" pulsed electroplating cycle we mean an electroplating current that is pulsed to zero and positive values and to zero and negative values, as shown in FIG. 6B.

One such pulse pattern that we have found particularly outstanding has the following characteristics:

| POSITIVE PULSE CONDITIONS | |
|---|---|
| Peak Current Density | 200–400 Amperes/ft$^2$ |
| Pulse Time On | 0.5 to 1.0 millisecond |
| Pulse Time Off | 2.0 to 9.0 milliseconds |
| Duty Cycle | 10% to 20% |
| Positive Direction Time | 20 to 40 seconds |

| REVERSE PULSE CONDITIONS | |
|---|---|
| Peak Current Density | 300 to 800 Amperes/ft$^2$ |
| Pulse Time On | 0.5 to 1.0 millisecond |
| Pulse Time Off | 2.0 to 9.0 milliseconds |
| Duty Cycle | 10% to 20% |
| Reverse Direction Time | 1 to 5 seconds |

Gold, solder (as Pb—Sn or Bi—Sn) or even a thin overcoat of Pd may be applied atop the dendrites formed thereby.

The resulting dendrites have a peak height of about 10 to 100 microns and a density (dendrites per unit area) of about 200 to 500 dendrites per square millimeter. Dendrites have a chip connect pad to dendritic pad contact resistance of about 3 to 5 milliohms.

While the invention has been described with respect to dendrites, it is, of course, to be understood that conical connectors may also be utilized on the substrate or fixture. Conical connectors are described in the commonly assigned U.S. Pat. No. 5,118,299 of Francis C. Burns, John J. Kaufman, David E. King, and Alan D. Knight, for CONE ELECTRICAL CONTACT, the disclosure of which is hereby incorporated herein by reference. Conical connectors are prepared by depositing an imagable polymeric material, as polyimide, and forming polymeric cones, as by laser ablation. The conical connectors are then coated, e.g., with a sputter chromium adhesion layer approximately 150 Angstroms thick, followed by sputter coating of a Cu layer approximately 10,000 to 100,000 Angstroms thick. A nickel coating approximately 0.1 to 1 mil thick is deposited atop the Cu, followed by a thin Au film.

Integrated Circuit Chip Test Procedures (Test Fixture)

Figure 2:
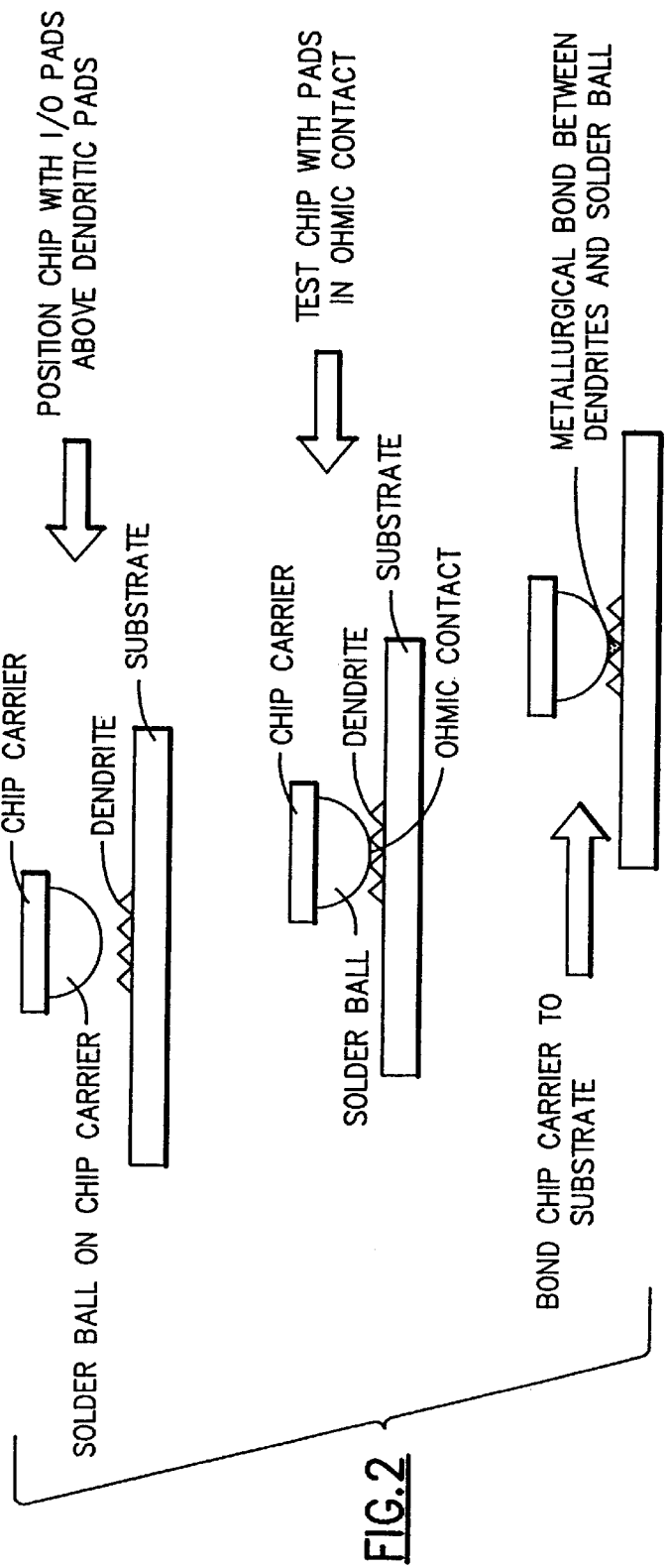
FIG. 2 is a schematic flow chart of the method of the invention.

The integrated circuit chip is tested substantially as shown in FIG. 2. The integrated circuit chip, with connectors on its substrate facing is positioned on the substrate or test fixture. In a preferred embodiment the chip contacts or connectors on the chip bonding surface have deposited solder connectors, as solder balls or C4 (controlled collapse chip connectors) thereon for bonding to the substrate.

The substrate or fixture has dendrites on the chip connect surfaces, contacts, or pads, substantially as described above. The chip and substrate are brought into contact and a compressive force is applied to the chip and substrate. The compressive force is sufficient to allow the dendrites to break through any oxide or corrosion films on the solder balls or C4 connectors on the chip. This provides direct, metal to metal contact, characterized by a contact resistance of less then 10 milliohms, and preferably less than 6 milliohms.

The integrated circuit chip is powered, e.g., between inputs of $V_{DD}$ or $V_{CC}$, and Ground, and subjected to various logic and memory tests. Chips that fail to pass these tests are discarded, while chips that pass these tests are installed in systems. In a particularly preferred exemplification of the invention the testing fixture is also the substrate, and chips that pass are bonded to the substrate between the bonding pad and the dendritic surface. Bonding may be by thermal compression bonding, transient liquid phase bonding, solder reflow, controlled collapse chip connect (C4 bonding) or the like. In the case of polymeric substrates bonding should take place below about 200 degrees Centigrade. After bonding the bond, or the bond, chip, and adjacent areas of substrate, may be encapsulated in a suitable organic encapsulant. Thus, after testing the Au, Bi—Sn, Pb—Sn, or other low melting film, coating or layer on the dendrites may be caused to fuse, bond, or alloy with the older balls or low melting materials on the integrated circuit chip to form an electrical or electrical and metallurgical bond.

Integrated Circuit Test Procedures (Test Vectors)

The integrated circuit chip may be tested for various defects while in dendritic contact with the dendritic surfaced pad. While the description herein is of the type of test procedures normally utilized for memory chips, especially CMOS memory chips, it is, of course, to be understood that the method of this invention is equally applicable to logic integrated circuit chips, and even to analog integrated circuit chips, as power processing chips and amplifier chips.

In the case of memory chips, the chip or chips may be tested for "cell stuck" faults. In a "cell stuck at" fault, one or more cells or gates are stuck-at-1 or stuck-at-0. When a cell or gate is stuck-at-x, it will remain stuck-at-x regardless of what is done to the cell or to surrounding cells or gates.

Memory chips have a decoder. The decoder is the combinational circuit that selects a unique memory word corresponding to an address. Failures in decoder logic result in "no access faults" and in "multiple access faults." In "no access faults" the decoder will not address the accessed cell. The decoder may address non-addressed cells. In "multiple access faults" the decoder will address multiple cells, possibly including the addressed cell. *

"No access" faults are similar to "stuck-at-x" faults except that the failure is in the decoder and not the memory array, and"multiple access" faults are similar to "coupling" or "pattern sensitive" faults, except, again, the failure is in the decoder and not the memory array.

Integrated circuits are also susceptible to pattern sensitive faults. Pattern sensitive faults exist when cells are "coupled." Cells are "coupled" when a transition at a cell, due to a write operation at this cell, changes the contents of a second cell, independently of the contents of the second cell or of any other cells. Coupling can be uni-directional, i.e., a change the state of cell i can change the state of cell j, but a change of the state of cell j does not change the state of cell i, or bi-directional, i.e., a change of the state of cell i changes the state of cell j, and a change of the state of cell j changes the state of cell i. Typically, pattern sensitive faults are identified with capacitive coupling and leakage currents.

Another class of faults to which integrated circuit chips, especially memory chips, are susceptible to are faults in access circuitry. Accessing faults occur when more then one memory cell is accessed during a READ or WRITE operation. During a READ operation at some address, i,j, more then one cell can be accessed, and the output is some combinatorial function of the contents of both cells. During a write operation at one of the "coupled" addresses, all of the activated or accessed cells are written to simultaneously. Other types of accessing faults occur when the sense amplifier logic or the write driver logic are "stuck at X." These faults may be due to capacitive coupling or due to shorts.

A memory array, with column and row decoders is shown in FIG. 3. Consider a simplified RAM having a 8×4 memory array of 8 rows by 4 words per row. The routine shown below, which requires 4n tests (where n is the number of memory cells in the memory array) detects decoder faults and cell "stuck at" faults.

For i=0 to i=n−1
Write ($c_i$, 0)
For i=0 to i=n−1
Read ($c_i$, =0)
Write ($c_i$, =1)
Read ($c_i$, =1)

Another test used in testing CMOS integrated memory circuits is the March Test. The March Test is a finite sequence of March Elements. A March Element is a finite sequence of operations (Read, Write 1. Write 0, Write the complement) applied to every cell in the memory array. The operations can be applied in either increasing address order (from address 0) or in decreasing address order (from address n−1). The same operations are applied to each cell.

There are various procedures for generating the March test pattern. Specifically, one such procedure starts by classifying possible physical defects (shorts, opens, oxide too thin, etc.) likely to effect memory functionality or having a high probability of occurrence.

Next, the circuit is simulated by a circuit simulator, as SPICE or ASTAP. The purpose of this simulation is to determine the impact the effect of the physical defect on the memory. Defects can affect either memory functionality or memory performance.

The faults determined by SPICE or ASTAP simulation are then mapped into specific memory failure modes, that is, "Stuck-At-X" or "Access" or "Coupling" failure modes.

Functional test patterns are then derived from the failure modes. The test patterns are derived to cover all of the failure modes identified for the memory.

The test patterns are then run against the simulator to insure that the test pattern detects defined failure modes.

Most defects are memory cell defects that initially appear as a "Stuck-At-X" defect. However, sometimes a defective cell can drive the entire output of an entire row, or appear as a pattern sensitive fault.

The March Test is particularly preferred for testing the decoder. The March Test tests for cell "stuck at" faults, and it tests for coupling faults. However, the March Test does not test for pattern sensitive faults. This is because the March test is linearly sequential, and can mask pattern sensitive faults.

In the March Test, the signal pattern is
For i=0,1, . . . , n−1
Write ($c_i$,0)
For i=0,1, . . . , n−1
Read ($c_i$,=0)
Write ($c_i$,=1)
Read ($c_i$,=1)
For i=n−1, n−2, . . . , 0
Read ($c_i$,=1)
Write ($c_i$,=0)
Read ($c_i$,=0)
Repeat the above steps, interchanging 0's and 1's.

The March Test detects the following faults:

a. Stuck Cell. To detect a "Stuck-At-1" fault in a memory cell, the cell must be initialized to 0, and the value 0 must actually be read. If 0 is read, there is no "Stuck-At-1" fault. Similarly, to detect a "Stuck-At-0" fault in a memory cell, the cell must be initialized to 1, and the value 1 must actually be read. If 1 is read, there is no "Stuck-At-0" fault.

b. No-select on Write. The No select on write fault is a Write Decoder fault. Define $f_0f_1f_2f_3f_4f_5f_6f_7$ be the memory word not selected as the result of the fault. A necessary and sufficient condition for detecting the No Select On Write fault is that:
   i. Write pattern a at word f.
   ii. Write and read the complement of pattern a from f.
Since the word f can not be selected for a Write operation, the word contains a random pattern. Writing and reading a specific pattern is necessary to detect this failure mode.

c. No Select On Read. This is read decoder failure mode.

d. Write Multiple Words. Let i be the word being addressed and f be the word actually being written as a result of the Write Multiple Words failure. To detect the Write Multiple Words failure,
   i. f should contain the complement of the pattern written at i. This is necessary to distinguish between the patterns at i and f.
   ii. The test sequence for each word i should include
      a. Read pattern a at location i.
      b. Write complement of a at location i. This reads the complement data at f before the value in f is destroyed.
      c. Ripple the linear addressing through the memory.
   If f>i and conditions i and ii are satisfied, then the fault is detected when addressing in ascending order. If f<i then the fault is detected when addressing is descending order.

e. Read Multiple Words. This failure, also called multi-select, occurs when two words are read simultaneously. In the test for this failure mode the two words i and f should have complementary data. The sense amplifier should be able to discriminate between reading a simultaneous 0 and 1 on the same line, and reading normal 0's and 1's.

f. Shorts Between Read Ports. This is an electrical failure, that can result in a Read To Write Port short, a Write to Read Port Short, or a Write To Write Port Short.

An improved March Test Pattern that can be utilized with the structure and method of the invention is:
1. Initialization to write the background pattern, For i=1 to n−1 Write to the $i^{th}$ row a background pattern, $a_i$.
2. Forward ripple. This reads the background pattern and writes the complement, rippling though the address space from 0 to n. For i=1 to n−1, read the background pattern, write the complement of the background back into the row, read the row, and increment the row decoder.
3. Reverse ripple. This reads the new background pattern (the complement of the previous contents of the row— hopefully), writes the complement (which is, hopefully, the original background pattern of the row), and ripples through the address space from n−1 to o. For i=n−1 to 0, read the contents of the row, write the complement of the row back into the row, and ripple through the address space from n−1 to 0.

The method and structure of the invention can be used to test for Pattern Sensitive Faults. Pattern sensitive faults can be passive or active.

Passive pattern sensitive faults are faults such that a pattern of cell values prevents writing a value into a cell. A passive pattern sensitive fault pattern is shown in FIG. 4. In the Figure the states of cells, A, B, C, and D determine the state of cell E, that is $A=B=C=D=0 \Rightarrow E=0$.

Active pattern sensitive faults occur when the change of value in one memory cell causes the value stored in another cell to change. An active pattern sensitive fault is shown in the FIG. 5, where the contents of cell D determine the contents of cell E. That is, $A=B=C \neq >D,E$, but $D\uparrow => E\uparrow$.

Passive pattern sensitive faults are tested for by setting the contents of the adjacent memory cells, A, B, C, D from {0,1}, and setting the base cell, E, to $E=\uparrow$ and $E=\downarrow$, and reading the base cell, E. For a passive pattern sensitive fault, we expect the measured value of the contents of cell E to be a function of the contents of the surrounding cells, and not necessarily the value set by the testing program.

In testing for active pattern sensitive faults, we place fixed values in three of the four neighboring cells (i.e., three of the four cells, A, B, C, and D), and the base cell. We then transition the remaining neighbor cell, and see if this changes the contents of the base cell, E.

Testing for passive pattern sensitive faults requires~65n tests, where n is the number of cells. Testing for active pattern sensitive faults requires~100n tests, where n is the number of cells.

The above described tests and test procedures may be applied to an integrated circuit chip in situ in the environment where it is to function in service, along with actual fan-out and latency effects. This is a particular advantage over existing test procedures.

While the invention has been described with respect to certain preferred embodiments and exemplifications hereof, it is not intended to limit the scope of the invention thereby, but solely by the claims appended hereto.

What is claimed is:

1. A method of testing a semiconductor integrated circuit flip chip in-situ while said integrated circuit flip chip is positioned on a substrate, said integrated circuit flip chip including a first facing surface adapted for facing said substrate when said integrated circuit flip chip is positioned on said substrate and including a first plurality of contacts positioned thereon, selected ones of said contacts including a solder ball, said method comprising:

providing a substrate having a second facing surface including a second plurality of contacts thereon, said second plurality of contacts comprising dendrites adapted for contacting respective ones of said solder balls of said first plurality of contacts on said first facing surface of said integrated circuit flip chip when said integrated circuit flip chip is positioned on said substrate;

bringing selected ones of said solder balls into contact with respective ones of said dendrites of said second plurality of contacts on said second facing surface of said substrate;

applying a compressive force to said integrated circuit flip chip and said substrate sufficient to cause said dendrites to penetrate through any oxide or corrosive films on said selected ones of said solder balls;

passing test signal inputs to said integrated circuit flip chip while said integrated circuit flip chip is positioned on said substrate and said compressive force is applied thereto, and thereafter receiving test signal outputs from said integrated circuit flip chip;

determining whether said test signals from said integrated circuit flip chip are correct or incorrect; and thereafter, bonding said integrated circuit flip chip solder balls to said contacts if said test signals from said integrated circuit flip chip are correct and removing said integrated circuit flip chip from said substrate if said test signals from said integrated circuit flip chip are incorrect.

2. The method of claim 1 wherein said bonding is accomplished by thermal compression bonding.

3. The method of claim 1 wherein said bonding is accomplished by transient liquid phase bonding.

4. The method of claim 1 wherein said bonding is accomplished by solder reflow.

5. The method of claim 1 wherein said bonding is accomplished by C4 bonding.

* * * * *